United States Patent [19]

Hecht

[11] 4,034,142
[45] July 5, 1977

[54] SUPERALLOY BASE HAVING A COATING CONTAINING SILICON FOR CORROSION/OXIDATION PROTECTION

[75] Inventor: Ralph Julius Hecht, West Palm Beach, Fla.

[73] Assignee: United Technologies Corporation, Hartford, Conn.

[22] Filed: Dec. 31, 1975

[21] Appl. No.: 645,763

[52] U.S. Cl. .......................... 428/678; 204/192 C; 427/250
[51] Int. Cl.² ......................................... B32B 15/00
[58] Field of Search .................... 29/194; 204/192; 427/250

[56] References Cited

UNITED STATES PATENTS 3,741,791  6/1973  Maxwell et al. ................. 29/194 X
3,869,779  3/1975  Gedwill et al. ...................... 29/194

Primary Examiner—L. Dewayne Rutledge
Assistant Examiner—E. L. Weise
Attorney, Agent, or Firm—Charles E. Sohl

[57] ABSTRACT

Coatings are described which are particularly suited for the protection of nickel and cobalt superalloy articles at elevated temperatures. The protective nature of the coatings is due to the formation of an alumina layer on the surface of the coating which serves to reduce oxidation/corrosion. The coatings contain aluminum, chromium, yttrium (or other oxygen active elements) and a metal chosen from the group consisting of nickel, cobalt and iron or mixtures thereof. The coatings further contain a controlled percentage of silicon which serves to greatly improve the protection afforded by the alumina film to the surface of the coating.

15 Claims, 2 Drawing Figures

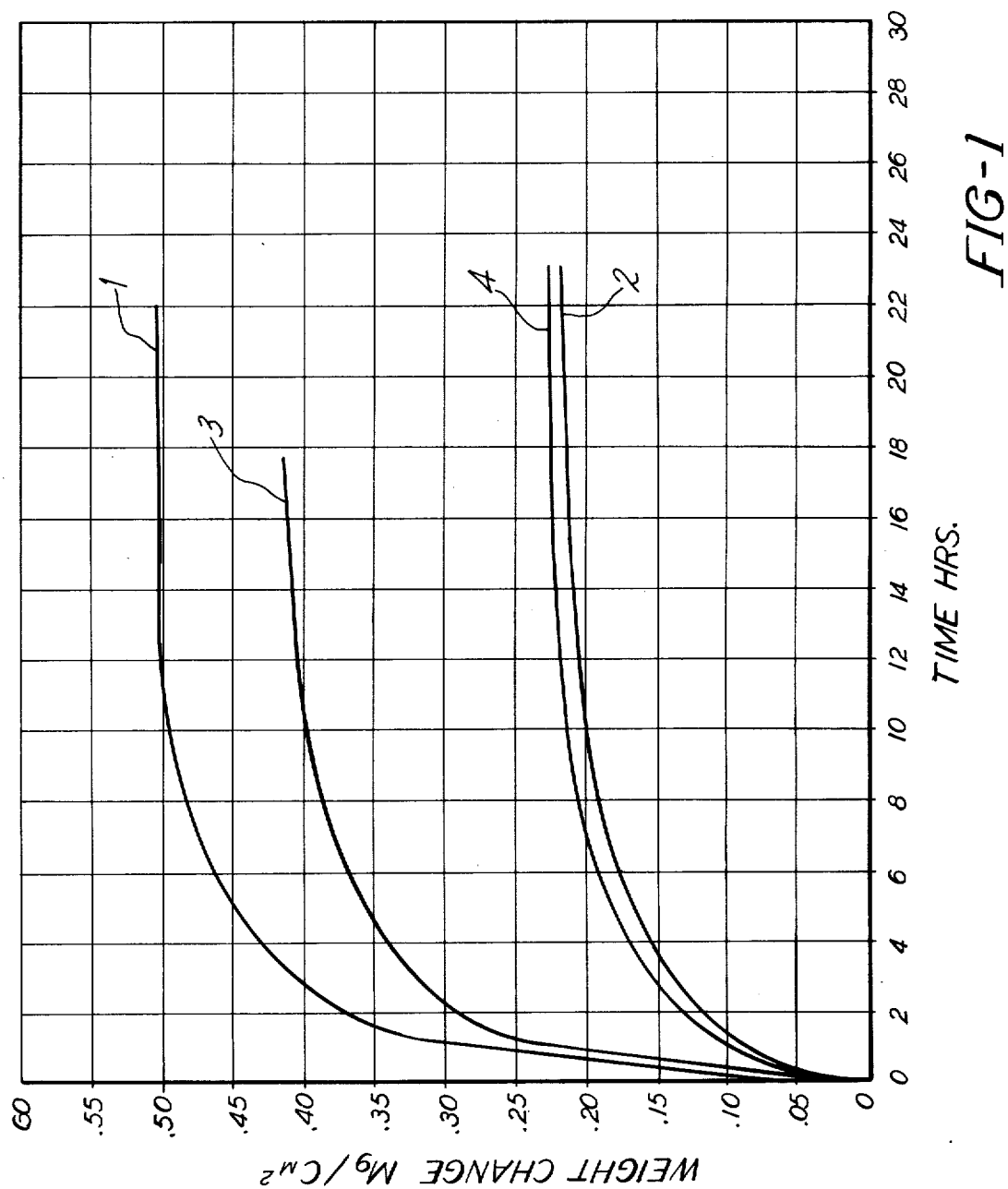

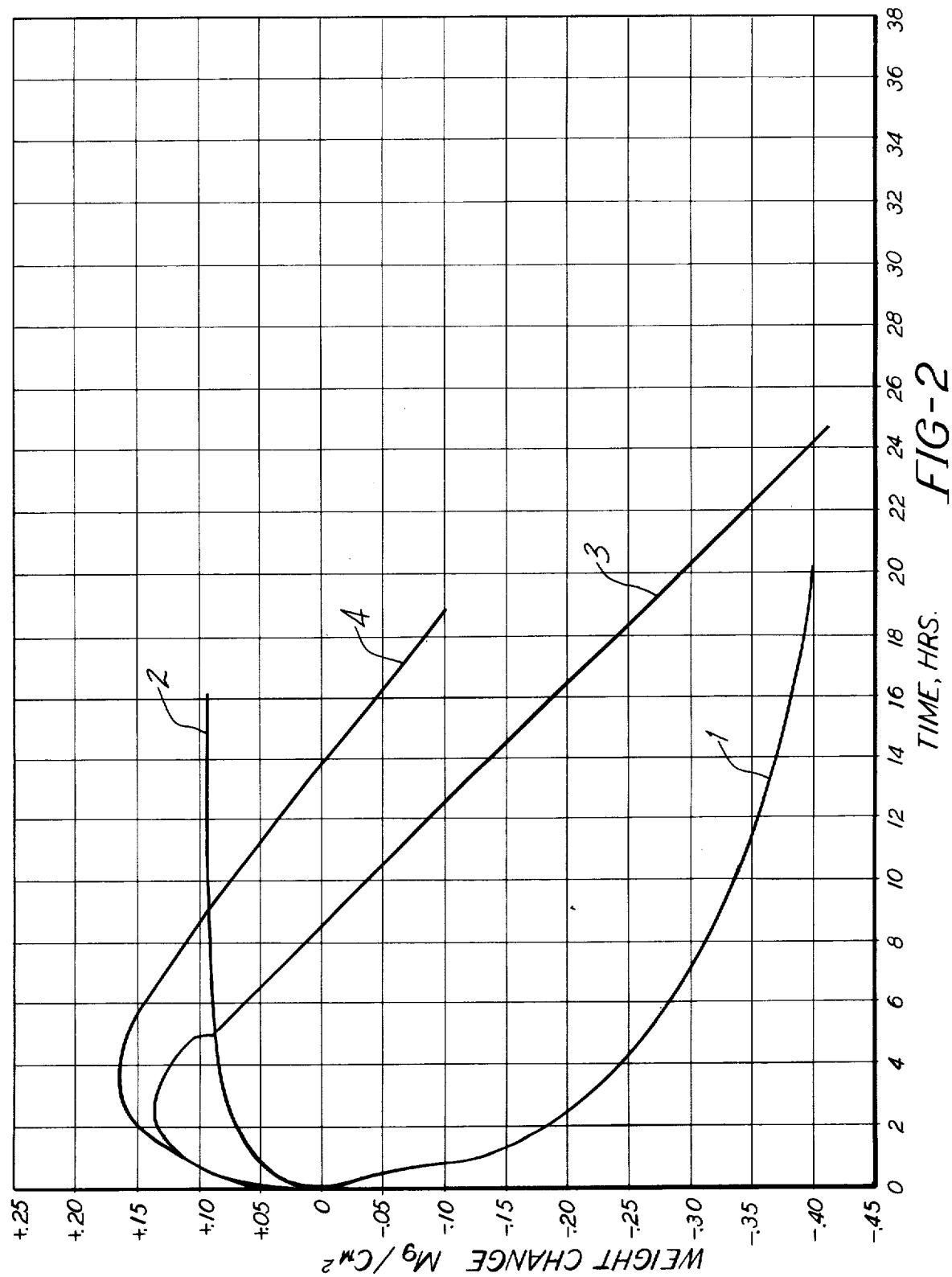

SUPERALLOY BASE HAVING A COATING CONTAINING SILICON FOR CORROSION/OXIDATION PROTECTION

BACKGROUND OF THE INVENTION

1. Field of the Invention

This invention relates to the field of protective coatings for use on nickel and cobalt base alloys, particularly at high temperatures, to reduce oxidation/corrosion.

2. Description of the Prior Art

Nickel and cobalt base superalloys are widely used under conditions of high temperature where oxidation/corrosion are serious problems. Such alloys find particular use in the field of gas turbine engines, where increased efficiency can be obtained by operation at higher temperatures. Under such increased temperatures oxidation/corrosion becomes a greater problem and for this reason current gas turbine engine practice is to use protective coatings on a majority of nickel and cobalt alloy parts which are used at elevated temperatures. The term "oxidation/corrosion" is meant to refer to high temperature interactions between the superalloy or coated superalloy and the environment. The major active element is oxygen, however corrosive effects can result from other elements such as sodium, sulfur, vanadium and other alkali metals or alkali metal compounds. The most successful known type of coatings are those which rely on the formation of a continuous layer comprised predominately of aluminum oxide ($Al_2O_3$) on the surface of the coating which acts as a diffusion barrier to minimize further reactions. Alumina has been found to be the most effective protective material with regard to oxygen and is also beneficial with regard to most of the other reactive environmental elements. The function of protective coatings is to form a barrier which minimizes the reaction of the environment with the superalloy base material. This function is performed by the formation of an alumina layer on the coating surface. A major problem encountered with such coatings is that the coefficient of thermal expansion of the alumina layer differs from the coefficient of expansion of the base material and the coating material which are generally similar. During thermal cycling stresses develop between the alumina layer and the coating material. The alumina layer, which is relatively brittle, tends to crack and spall off thus exposing a fresh surface to the deleterious atmosphere. This repeated formation and spallation of the oxide layer causes the recduction of the coating material in aluminum content. When the aluminum level of the coating material drops below a certain point the coating becomes ineffective as an alumina former and the protective benefits of the coating material are lost.

It has been found in the past that the addition of yttrium to the coating material improves the adherence of the alumina layer to the surface of the coating material. Alumina forming coating materials containing yttrium are described in U.S. Pat. Nos. 3,528,861, 3,542,530, 3,649,225 and 3,676,085 all of which are assigned to the assignee of the present invention.

U.S. Pat. No. 3,102,044, assigned to the present assignee, describes a method of applying coatings and includes a description of an aluminum-10% silicon coating system. Both the coating application technique and the coating composition are fundamentally from the invention which will be described herein. U.S. Pat. No. 3,741,791, also assigned to the present assignee describes a coating which contains chromium, aluminum, yttrium and 10–16% silicon in a cobalt/nickel base. This relatively large silicon addition is made in order to depress the melting point thus aiding in the diffusion of the coating into the substrate. No particular enhancement of oxide adherence is contemplated by the patent.

SUMMARY OF THE INVENTION

In this application, all compositions are given in weight percent unless otherwise specified. The coating composition of the present invention contains from 10–40% chromium, from 6–20% aluminum, from 0.1 to 0.7% yttrium (or other oxygen active elements), from 0.5–7% silicon with a balance selected from the group consisting of nickel, cobalt and iron and mixtures thereof. The coating of the present invention may be applied by several different techniques including plasma spray techniques, sputtering, vapor deposition and ion plating. Upon exposure to oxidation/corrosion inducing environment the coating forms a layer comprised predominately of alumina which serves to protect the coating material from further oxidation/corrosion.

The foregoing, and other objects, features and advantages of the present invention will become more apparent in the light of the following detailed description of the preferred embodiment thereof as shown in the accompanying drawings.

BRIEF DESCRIPTION OF THE DRAWING

FIG. 1 shows a plot of the oxidation performance of the present coating as a function of time at 1000° C; and FIG. 2 shows a plot of the oxidation/corrosion resistance of the present coating as a function of time at 1,000° C.

DESCRIPTION OF THE PREFERRED EMBODIMENTS

The advantages of the present coatings, which contain silicon and yttrium, over the prior art coatings which contain yttrium alone are related to the greater adherence of the alumina layer. The exact process by which additions of silicon improve the adherence of the protective alumina coating is not well understood at the time, however the improvement is marked.

In the concept of the invention the addition of controlled amounts of silicon ranging from 0.5% to 7% Si to coatings to promote alumina adherence, may be applied to several coating compositions. In particular, coatings based on cobalt, nickel, iron and mixtures thereof are preferred. The broad limits on the remaining constituents are from about 10 to about 45% chromium, from about 6 to about 25% aluminum, and from 0.1 to about 0.7% of a material chosen from the group of oxygen active elements including the group III B elements, the lanthanides and the actinides, and mixtures thereof. This group includes, but is not limited to yttrium, scandium, cerium and lanthanium; mixtures, such as misch metal are also contemplated. A preferred composition range of the present invention consists of from about 10 to about 20% aluminum, from about 0.1 to about 0.7% of an oxygen active element from about 1 to about 3% silicon, balance chosen from the group consisting of nickel, cobalt, iron and mixtures thereof. In a particularly preferred composition, the ranges are as previously indicated with respect to the preferred embodiment but the oxygen active element is predominately yttrium and the base is nickel and cobalt and mixtures thereof. When the coating is used in gas turbine applications the preferred coating thickness will be from about 0.001 to about 0.010 inches. In the compositions set forth above, the silicon is present in elemental form as a solid solution in both the gamma and beta phases which are found in the coating. No deleterious phases are observed to form either in the coating or at the coating-substrate interface even after exposure to elevated temperature for extended periods of time. The preceding composition limits are illustrative of the invention and naturally small amounts of other elements may be added in amounts which do not affect the fundamental nature and behavior of the coating layer.

The coatings of the present invention may be applied by several techniques which may broadly be termed physical vapor deposition processes. This class includes plasma methods, sputtering, vapor deposition and ion plating. Sputtering appears to be the preferred process.

The coatings of the present inventions have many potential uses, among these are gas turbine parts, furnace components, and industrial chemical processing apparatus. The broad range of coatings of this invention is particularly adapted for use in protecting the superalloy components which are used in gas turbine engines, such as blades and vanes. Superalloys are those alloys, usally based on nickel or cobalt which possess relatively high strengths at elevated temperatures.

The present invention will be better understood through reference to the following illustrative examples.

EXAMPLE I

Coating composition samples were prepared in cast form, the compositions prepared are listed in Table I. (There is normally an excellent correlation between oxidation/corrosion resistance in cast form and in coating form. Usually better behavior is exhibited in coating form than in cast form.)

TABLE I

| Alloy No. | Cr | Al | Co | Ni | Y | Si |
|---|---|---|---|---|---|---|
| 1 | 20.0 | 13.3 | Bal | 35.5 | .33 | .9 |
| 2 | 21.1 | 13.4 | Bal | 35.5 | .36 | 2.0 |
| 3 | 19.6 | 10.5 | Bal | 35.5 | .42 | — |
| 4 | 19.9 | 12.4 | Bal | 35.2 | .36 | — |

These samples were tested in air at 1000° C for periods of time up to about 30 hours. The results are shown in FIG. 1 which shows weight change per unit area as a function of exposure time.

In this type of test, the oxidation behavior of the coating is evaluated by measuring the change in weight of the sample. Two processes occur which cause the weight change: formation of an oxide layer leads to an increase, while spallation of the oxide leads to a decrease. The processes of formation and spallation are competitive in the sense that the actual change in weight reflects the combined effects of the two processes. The most desirable situation is the formation of a thin adherent oxide layer which then increases at a rate inversely proportional to its thickness. Thus in evaluating oxidation data in the form of weight change curves, the desirable curve would show an initial small increase followed by a steady state portion with only a minimal weight increase.

From FIG. 1 it can be seen that although the 0.9% Si composition (alloy 1) had relatively low oxidation resistance, the 2.0% Si (alloy) 2) composition had the greatest oxidation resistance of any of the samples tested. Even the 0.9% Si material exhibited a stable horizontal curve indicating little significant weight gain after about 20 hours. From this it follows that a silicon level greater than 0.9% is desirable where oxidation is a particular problem.

EXAMPLE II

Cast samples of the same composition listed in Table I were tested for corrosion resistance. Sodium sulfate ($Na_2SO_4$) was placed on the surface in a concentration of about 1 mg/cm$^2$ and the samples were then evaluated for weight change at 1000° C in air for about 30 hours. (The $Na_2SO_4$ coating simulates corrosion which results from a combination of fuel impurities and environmental effects which are problems with gas turbine engines.) The results are shown in FIG. 2. In FIG. 2, alloy 1 (0.9 Si) appears to be approaching equilibrium after about 20 hours with a weight loss of 0.4 mg/cm$^2$. Although this is a relatively high weight loss, the behavior is more encouraging than that displayed by the silicon free alloys which exhibited straight line behavior with no apparent leveling out. Again, the 2.0% Si alloy (alloy 2) exhibits better behavior than any of the other alloys tested. From this example it can be seen that Si levels of 0.9% and above appear to improve the hot corrosion resistance of the class of coatings which contain chromium, aluminum, and yttrium in a nickel/cobalt base.

Although the invention has been shown and described with respect to a preferred embodiment thereof, it should be understood by those skilled in the art that various changes and omissions in the form and detail thereof may be made therein without departing from the spirit and the scope of the invention.

Having thus described a typical embodiment of our invention, that which we claim as new and desire to secure by Letters Patent of the United States is:

1. An article suitable for use at elevated temperature which comprises:
   a. a superalloy base material
   b. a coating on the superalloy base material having a composition of from about 10 to about 45% chromium, from about 6 to about 25% aluminum, from about .1 to about 0.7% of an oxygen active element selected from the group consisting of the Group III B elements, the lanthanides, the actinides, and mixtures thereof, from about 0.5 to about 7% silicon, balance selected from the group consisting of nickel, cobalt and iron and mixtures thereof, said silicon being present in elemental form in solid solution, said coating tending to form an external continuous layer composed predominately of alumina.

2. An article as in claim 1 wherein the oxygen active element is selected from the group consisting of yttrium, scandium, cerium, lanthanum and mixtures thereof.

3. An article as in claim 1 wherein the coating composition contains from about 10 to about 35% chromium.

4. An article as in claim 1 wherein the coating composition contains from about 1 to about 3% silicon.

5. An article as in claim 1 wherein the coating composition contains from about 10 to about 20% aluminum.

6. An article as in claim 1 wherein the oxygen active element is predominately yttrium.

7. A gas turbine engine component which comprises:
   a. a superalloy base
   b. a coating on the superalloy base having a composition of from about 10 to about 45% chromium, from about 6 to about 25% aluminum, from about .1 to about 0.7% of an oxygen active element selected from the group consisting of the Group III B elements, the lanthanides, the actinides, and mixtures thereof, from about 0.5 to about 7% silicon, balance selected from the group consisting of nickel, cobalt and iron and mixtures thereof, said silicon being present in elemental form in solid solution,
   said coating tending to form an external continuous protective layer composed predominately of alumina.

8. A coating composition useful for the protection of superalloy articles against oxidation/corrosion at elevated temperatures consisting essentially of:
   from about 10 to about 45% chromium, from about 6 to about 25% aluminum, from about 0.1 to about 0.7% of an oxygen active element selected from the group consisting of the Group III B elements, the lanthanides, and actinides, and mixtures thereof, about 0.5 to about 7% silicon, balance chosen from the group consisting of nickel, cobalt, iron and mixtures thereof,
   said coating tending to form an external continuous protective layer composed predominately of alumina.

9. An article as in claim 8 wherein the oxygen active element is selected from the group consisting of yttrium, scandium, cerium, lanthanum and mixtures thereof.

10. A coating composition as in claim 8 wherein the oxygen active element is predominately yttrium.

11. A coating composition as in claim 8 which contains from about 10 to about 35% chromium.

12. A coating composition as in claim 8 which contains from about 10 to about 20% aluminum.

13. A coating composition as in claim 8 which contains from about 1 to about 3% silicon.

14. A method of protecting superalloy articles from oxidation/corrosion at elevated temperatures which comprises:
   applying a layer of material to the surface of the article by a physical vapor deposition process, said material having a thickness of from 0.001 to 0.010 inches and a composition of from about 10 to about 45% chromium, from about 6 to about 25% aluminum, from about 0.1 to about 0.7% of an oxygen active element selected from the group consisting of the Group III B elements, the lanthanides, the actinides, and mixtures thereof, from about 0.5 to about 7% silicon, balance thereof, chosen from the group consisting of nickel, cobalt, iron and mixtures thereof.

15. A method as in claim 14 wherein the physical vapor deposition process comprises sputtering.

* * * * *